United States Patent [19]

Horl

[11] 4,437,070
[45] Mar. 13, 1984

[54] AMPLIFIER ARRANGEMENT WHOSE OVERALL GAIN IS CONTROLLABLE BY MEANS OF A CONTROL VOLTAGE

[75] Inventor: Manfred Horl, Hamburg, Fed. Rep. of Germany

[73] Assignee: U.S. Philips Corporation, New York, N.Y.

[21] Appl. No.: 227,334

[22] Filed: Jan. 22, 1981

[30] Foreign Application Priority Data

Feb. 29, 1980 [DE] Fed. Rep. of Germany ....... 3007715

[51] Int. Cl.³ .......................... H03F 3/45; H03F 1/34; H03G 3/20
[52] U.S. Cl. ..................................... 330/254; 330/85; 330/129; 330/278
[58] Field of Search ................... 330/85, 86, 129, 254, 330/257, 260, 278

[56] References Cited

U.S. PATENT DOCUMENTS 3,908,172 9/1975 Aschermann et al. ............. 330/254
4,223,273 9/1980 Yokoyama ........................... 330/85

FOREIGN PATENT DOCUMENTS 2755827 6/1979 Fed. Rep. of Germany ...... 330/254

Primary Examiner—James B. Mullins
Assistant Examiner—Gene Wan
Attorney, Agent, or Firm—Robert T. Mayer; Bernard Franzblau

[57] ABSTRACT

Volume control circuits generally vary the overall gain of a low-frequency amplifier by varying the gain in a negative-feedback branch. At very high gain, at which very large output signals are obtained, the negative-feedback is then very small, which may produce a non-linear distortion. In accordance with the invention the gain of a frequency-compensation stage is varied so that it increases when the overall gain increases. The loop gain at higher output amplitudes is now higher than it would otherwise be so that non-linear distortion is reduced.

16 Claims, 3 Drawing Figures

AMPLIFIER ARRANGEMENT WHOSE OVERALL GAIN IS CONTROLLABLE BY MEANS OF A CONTROL VOLTAGE

The invention relates to an amplifier arrangement whose overall gain is controllable by means of a control voltage which varies the negative feedback. This arrangement comprises an amplifier branch and at least one negative-feedback branch coupled from an output to an input of the amplifier branch. The amplifier branch includes a stage with a low-pass characteristic, which determines the frequency response of the loop gain.

Such a circuit arrangement is in principle known from German Auslegeschrift No. 24 04 331. The known amplifier arrangement comprises two cross-coupled differential amplifiers, i.e. four transistors, the three electrodes of each one of said transistors being connected to the corresponding electrodes of one of the other transistors and with each transistor having only one electrode in common with each other transistor. To the common output of this stage, which is constituted by one of the two collector connecting lines (the other collector connecting line is not used for amplification), an operational amplifier is connected. From the output of the operational amplifier two negative-feedback branches with different degrees of negative feedback are coupled to the two inputs of the two cross-coupled differential amplifiers, which inputs are constituted by the two emitter terminals. The control voltage is applied between the common base terminals.

If the control voltage is sufficiently high two of the four transistors are turned off so that only one of the two signals applied to the inputs of the two differential amplifiers is available at the common output. As a result only the negative-feedback branch leading to said input, i.e. the one with the lower degree of negative feedback, is operative. If the polarity of the control voltage is now reversed, the two other transistors are turned off and only the signal at the other input of the two differential amplifiers is applied to the common output. Then only the other negative-feedback branch (with the higher degree of negative-feedback) is operative. Although there are provided negative-feedback branches ech of which have a constant degree of negative-feedback, the negative-feedback then operative—and thus the overall gain of the amplifier arrangement—is controlled by the control voltage.

If the control voltage is selected so that the maximum degree of negative-feedback and thus the minimum overall gain is obtained, this results in a comparatively high loop gain. The loop gain is the product of the gain in the negative-feedback branch and the instantaneous degree of negative-feedback. As a result of this, the amplifier arrangement may become unstable, i.e. it tends to oscillate.

When the known amplifier is used in practice, for example in the form of the integrated circuit Valvo TCA 740, the amplifier branch in addition includes a stage with a low-pass characteristic. As is known (compare for example Tietze/Schenk "Halbleiterschaltungstechnik" 4th Edition 1978, Springer-Verlag, Chapter 7.4, or IEEE Journal of Solid-State Circuits, Vol. SC9, No. 6, December 1974, pages 314 to 332) such a "frequency-response correction" reduces the loop gain at increasing signal frequency to such an extent that it has decreased to unity before (in an inverting amplifier) the phase shift in the amplifier and negative-feedback branch has become 180°. This frequency response correction should be based on the most unfavourable case, i.e. on a maximum loop gain (or minimum overall gain or maximum degree of negative feedback).

The inventor has recognized that in such a circuit arrangement problems may arise if the overall gain is to be controllable by the control voltage over a very wide range (for example, 90 dB) and, if at the same time, a very low distortion at comparatively large output signals is to be obtained. At the maximum overall gain (=minimum degree of negative feedback) and at high frequencies the loop gain is comparatively small, so that in this case the non-linear distortion, which depends on the inevitable non-linearities of the amplifier elements, can no longer be eliminated completely by the negative feedback. Therefore, it is an object of the present invention to provide an amplifier arrangement of the type mentioned in the opening paragraph in which the non-linear distortion—also at high overall gain, high frequencies and a large drive—is reduced without giving rise to instabilities.

According to the invention this object is achieved in that the amplifier branch comprises an amplifier stage a controllable gain that can be controlled by the control voltage in such a way that at upon an increase in the overall gain the gain of the amplifier stage also increases.

The overall gain is not influenced significantly by the gain of the amplifier stage—it corresponds substantially to the inverse of the instantaneous degree of negative-feedback—, in contradistinction to the loop gain of the amplifier arrangement, whose magnitude is essential for eliminating non-linear distortion. According to the invention said loop gain at high overall gain is made higher than it would be in an amplifier arrangement of the type mentioned in the opening paragraph, i.e. one without an amplifier stage whose gain is thus controlled. Thus, a high overall gain with low non-linear distortion is obtained by means of the circuit arrangement in accordance with the invention.

In a further embodiment of the invention, based on the known amplifier circuit, comprises an amplifier branch having two cross-coupled amplifiers with a common output followed by an amplifier stage with a low-pass characteristic and a gain that is controllable by the control voltage. The output of the amplifier stage is coupled to the inputs of the two differential amplifiers via two negative-feed-back branches with different degrees of negative-feedback. Thus, the amplifier stage which is common to the two differential amplifiers has a low-pass characteristic and a gain that can be controlled by means of the control voltage.

As is for example known from the magazine "IEEE Journal of Solid-State Circuits", in particular FIG. 9, an amplifier stage with a low-pass characteristic may comprise a first amplifier section which supplies an impressed alternating current proportional to its input voltage, and is followed by a second amplifier section which is subject to negative-feedback via a capacitor. The gain of such an amplifier stage is proportional to the slope of the first amplifier section and is inversely proportional to the capacitance of the capacitor. Thus, the gain can be varied by varying the capacitance of the capacitor or by varying the slope. Varying the capacitance by means of a control voltage would be possible, for example if a variable-capacitance diode was used whose capacitance can be controlled by a direct voltage. However, this would give rise to additional nonlinearities. Therefore, in accordance with a further embodiment of the invention, the gain is varied by varying the slope. Use is now made of the fact that in a transistor amplifier circuit the slope is proportional to the direct current flowing through said circuit. This embodiment is characterized in that the d.c. setting element comprises the parallel connection of a constant current source and a direct current source whose direct current can be controlled by the control voltage.

The invention will be described in more detail with reference to the drawing in which.

Figure 1:
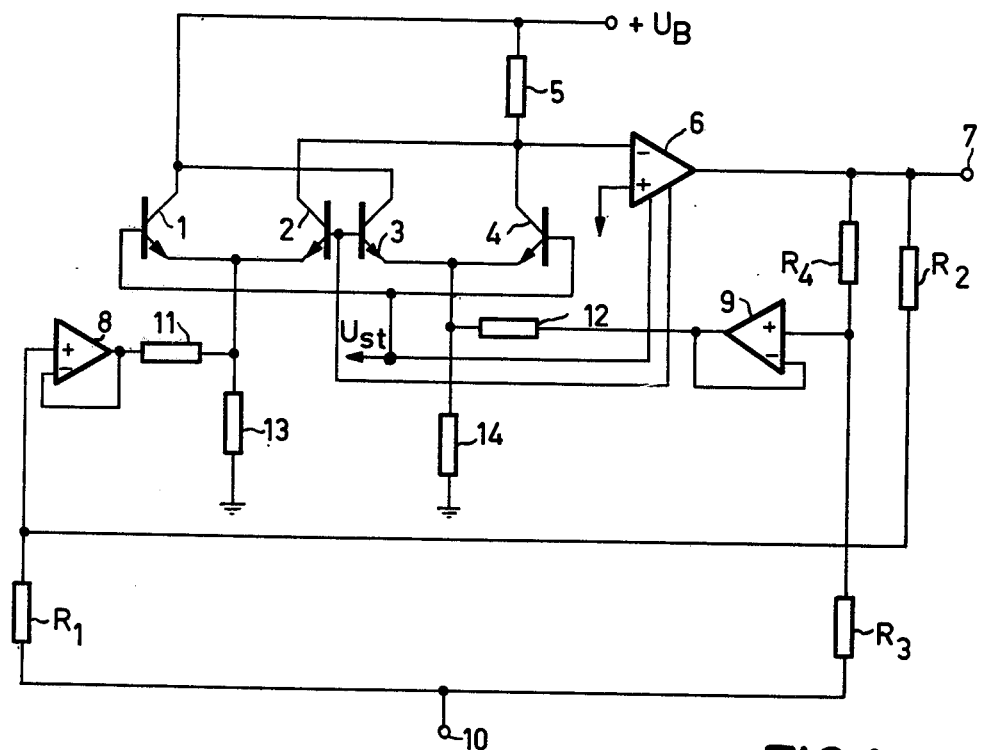
FIG. 1 represents the circuit diagram of the amplifier arrangement.

FIG. 1 shows four npn-transistors 1 ... 4, the transistors 1 and 2 as well as 3 and 4 being interconnected at their emitters. The transistors 1 and 3 as well as 2 and 4 have their collectors interconnected, and the transistors 1 and 4 as well as 2 and 3 have their bases interconnected. The common collector line of the transistors 2 and 4 includes a resistor 5 which serves as the output of the differential amplifier pair constituted by the transistors 1 ... 4. The voltage drop across said resistor is applied to the inverting input of an amplifier stage 6, to whose other input a reference voltage is applied.

The output 7 of the amplifier stage 6 constitutes the output of the complete amplifier arrangement. Via a resistor $R_2$ it is connected to the (non-inverting) input of an impedance-matching stage 8 (voltage gain 1) and via a resistor $R_4$ to the corresponding input of an identical impedance-matching stage 9.

Via a resistor $R_1$ or $R_3$ the respective inputs of the impedance-matching stages 8 and 9 are connected to a common input terminal 10 to which the signal to be processed by the amplifier arrangement is applied (the gain of this signal may also be substantially smaller than 1).

Via a resistor 11 or 12 the output of the respective impedance-matching stage 8 or 9 is connected to the respective common emitter terminals of the transistors 1, 2 or 3, 4, which is also connected to ground via a resistor 13 or 14, respectively. The impedance-matching stages 8 and 9 in conjunction with the resistors 11 ... 14 ensure that in the emitter lines of the transistors 1, 2 or 3, 4 a signal current flows which is proportional to the signal voltage at the input of the impedance-matching stage 8 or 9. Between the common base terminals of the transistors 2 and 3 on the one hand and 1 and 4 on the other hand, a control voltage $u_{st}$ is applied which, at the same time, controls the gain of the amplifier stage 6.

It is assumed that the quotient of the values of the resistors $R_2$ and $R_1$ is greater than 1, for example 30, and the quotient of the resistors $R_4$ and $R_3 << 1$. It is further assumed that the voltage $u_{st}$ has such a value and such a polarity that the base potential of the transistors 1 and 4 is approximately 120 mV more positive than the base potential of the transistors 2 and 3. The transistors 2 and 3 are then virtually cut off so that substantially the total signal current flows through the transistors 1 and 4. Since only the collector current of the transistor 4 flows through the resistor 5, which is connected to the positive supply voltage terminal $+U_B$, the overall gain in this operating condition is determined solely by the elements 4 ... 7, $R_4/R_3$, 9, 12 and 14. The degree of negative-feedback then corresponds to the value $R_3/(R_3+R_4)$, $R_4$ and $R_3$ being the values of the resistors $R_4$, $R_3$; the loop gain is maximum and the overall gain $R_4/R_3$ is minimum. The low-pass characteristic of the amplifier stage 6 is such that in this operating condition the loop gain has become smaller than 1 as the frequency increases before the phase of the signal has shifted through 180° (in addition to the 180° phase shift caused by the amplifier stage 6).

When the control voltage $u_{st}$ decreases, transistors 2 and 3 take over an increasing part of the emitter current so that the behaviour is then also determined by the resistors $R_2$ and $R_1$, the impedance-matching stage 8, the resistors 11 and 13 and the transistor 2. The degree of negative feedback then decreases. At the same time the gain of the amplifier stage 6 is increased by the decreasing control voltage $u_{st}$, but only to such an extent that no instabilities are caused. If the control voltage, for example, decreases to the value 0, half the signal current, which first flowed via transistor 4 only, will flow through transistor 3. The gain of the amplifier stage 6 may then be approximately a factor 2 higher than in the initially described operating condition without giving rise to oscillation tendencies.

Figure 2:
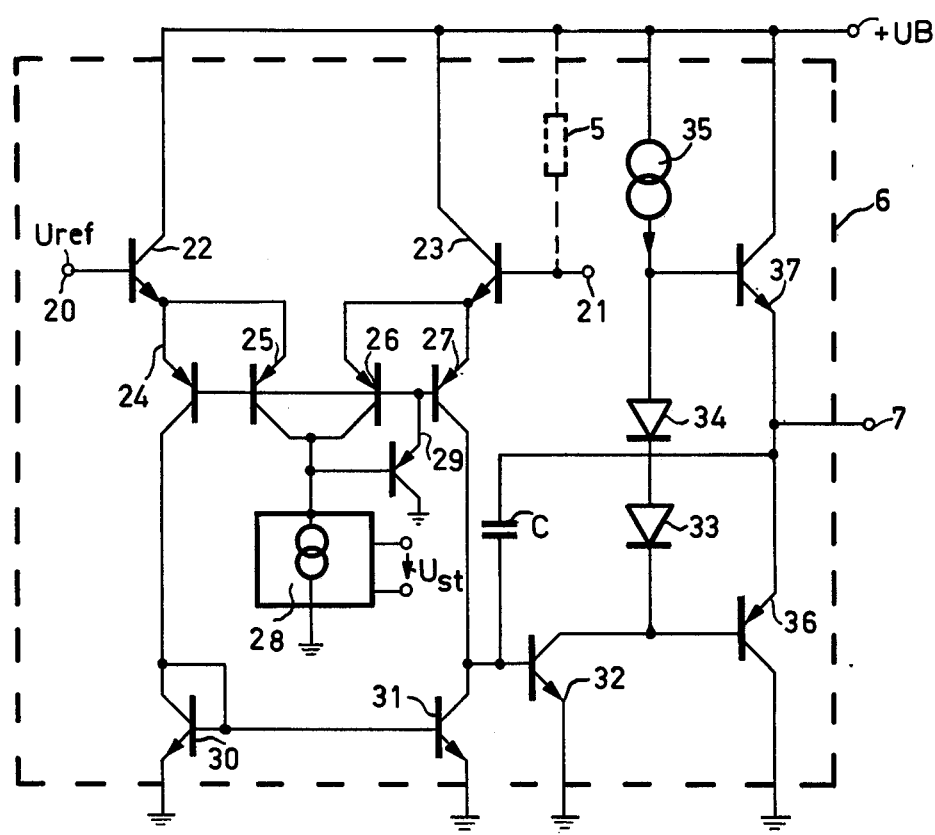
FIG. 2 represents the circuit diagram of the amplifier stage with controllable gain.

If the polarity of the control voltage is then reversed, the share of the current through transistor 2 will increase until only the collector current of the transistor 2 flows through the collector resistor 5. In this operating condition the degree of negative-feedback $(R_1/(R_1+R_2))$ is smaller than in the initial situation, which yields a higher overall gain. The higher the overall ratio $R_2/R_1$ is, the higher the gain of the amplifier arrangement 6 may be owing to the decreasing degree of negative-feedback, which would substantially reduce non-linear distortion without increasing the oscillation frequency of the circuit. The amplifier stage 6, as is shown in FIG. 2, comprises an input stage with a non-inverting input 20 and an inverting input 21. As is shown dashed, the inverting input 21 is connected to the output of the differential-amplifier stage 1 ... 4, whereas the non-inverting input 20 is connected to a suitable reference voltage $U_{ref}$. The inputs are constituted by the base terminals of two npn-transistors 22 and 23 having collector terminals connected to the positive supply voltage $+U_B$ and emitter electrodes each of which are connected to the emitters of two further transistors 24, 25 and 26, 27 respectively.

The base terminals of the four identical pnp-transistors 24 ... 27 are interconnected. Similarly, the collector electrodes of the transistors 25 and 26 are interconnected and connected to ground via a controllable direct current source 28. The controllable direct current source 28 supplies an impressed direct current whose magnitude can be controlled by means of the control voltage $u_{st}$. A pnp transistor 29 is connected to the base terminals of the transistors 24 ... 27 at its emitter, to the collector terminals of the transistors 25 and 26 at its base terminal, and to ground at its collector.

The direct current supplied by the controlled direct current source is distributed between the transistors 25 and 26 in a ratio which depends on the voltage across terminals 20 and 21. The portion which flows via transistor 26 increases if the potential on the terminal 21 is more positive than that on the terminal 20, and decreases if the potential on the terminal 21 is more negative than the potential on the terminal 20.

Transistors 24 and 27 conduct the same current as the transistors 25 and 26 respectively, because they have the same base-emitter voltage as these transistors. The collector current of the transistor 24 flows to a current mirror which comprises a npn transistor 30 whose collector is connected to the collector of the transistor 24 and to its own base (and therefore functions as a diode). The emitter of transistor 30 is connected to ground. The base of the transistor 30 is connected to the base of a further npn transistor 31 whose emitter is also connected to ground, so that it conducts substantially the same current as the transistor 30 or one of the transistors 24, 25. The collector of the transistor 31 is connected to the collector of the transistor 27. The difference between the collector currents of these transistors thus flows to an output stage.

This output stage comprises an npn transistor 32 whose base is connected to the common electrode terminal of the transistors 27 and 31 and whose emitter is connected to ground. Via two series-connected diodes 33 and 34 in the forward direction and a direct current source 35, its collector is connected to the positive supply voltage source $+U_B$. The collector of transistor 32 is also connected to the base terminal of a pnp transistor 36 also whose collector is connected to ground and whose emitter is connected to the emitter of an npn transistor 37. The collector of transistor 37 is connected to the positive supply voltage $+U_B$ and its base is connected to the junction point of the direct current source 35 and the diode chain 33, 34.

The transistors 36 and 37 constitute a push-pull output stage whose quiescent current is determined by the direct current source 35 and the diodes 34 and 33. The interconnected emitters of the transistors 36 and 37 constitute the output 7.

At higher frequencies $\omega$ the magnitude of the open-loop gain $v_0$ of the amplifier stage 6 shown in FIG. 2 (ratio between the signal voltages at the terminals 7 and 21) is given by $v_0 = S/\omega C$. S is the slope (ratio between output signal current and input signal voltage of the section of the amplifier stage comprising the components 22 ... 31) and C is the capacitance of the capacitor C. It is to be noted that the gain may be varied either by varying the capacitance of the capacitor C or by varying the slope S. A variation of the capacitance by a control voltage is possible by means of a variable-capacitance diode, but especially in the case of a large drive this gives rise to non-linear distortion, which is to be minimized by means of the invention. However, the slope of the amplifier section 22 ... 31 can easily be changed because it is proportional to the direct current supplied by the controlled direct-current source. Therefore, it suffices to vary the direct current by means of the control voltage $u_{st}$, namely in such a way that at increasing overall gain the direct current supplied by the controlled direct-current source increases.

Figure 3:
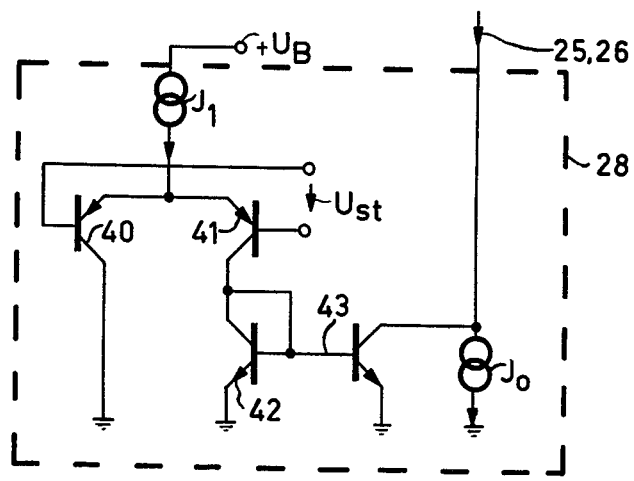
FIG. 3 represents the circuit diagram of the d.c. setting element.

FIG. 3 represents a suitable controlled direct-current source. It comprises a constant-current source $I_1$ coupled between the positive supply voltage terminal $+U_B$ and the interconnected emitters of the transistors 40 and 41 and which supplies an impressed current. The control voltage $u_{st}$ is applied to the base electrodes of the two transistors 40 and 41, which voltage thus determines how the direct current supplied by the direct current source $I_1$ is distributed among the transistors 40 and 41. The collector of the transistor 40 is connected directly to ground whereas the collector of the transistor 41 is connected to ground via a current mirror. This current mirror comprises an npn transistor 42, whose collector is connected to the collector of the transistor 41 and to its own base (so that said transistor functions as a diode), and whose emitter is connected to ground. The base of the transistor 42 is connected to the base of an npn transistor 43 whose emitter is connected to ground. The collector of the transistor 43 is connected to one terminal of a constant-current source $I_0$ which supplies an impressed direct current and whose other terminal is connected to ground.

The collectors of the transistors 25 and 26 (FIG. 2) are connected to the junction point of the collector of the transistor 43 and the constant-current source $I_0$ and thus receive a direct current which is formed by the constant component supplied by the constant current source $I_0$ and the collector direct current of the transistor 43. The latter current depends on the control voltage $u_{st}$.

If the base potential of the transistor 40 is positive relative to the base potential of the transistor 41 (the base potential of the transistor 4 is then also positive relative to the base potential of the transistor 2), substantially the entire direct current supplied by the direct current source $I_1$ will flow via transistor 40. The output of the controlled direct current source 28 is then substantially equal to the direct current supplied by the constant-current source $I_0$. If the potential difference between the base electrodes of the transistors 40 and 41 decreases, the portion of the direct current supplied by the direct current source $I_1$ and flowing through transistor 41 increases unit at a control voltage $u_{st}$ equal to 0 half the direct current flows through the transistor 41 and appears at the output of the controlled direct-current source (provided that the transistors 42 and 43 are identical). If the base potential of transistor 41 becomes more positive than the base potential of the transistor 40, the direct current portion flowing via transistor 41 will increase further until finally the total direct current of the current source of $I_1$ appears at the output of the controlled direct-current source.

The characteristic of the circuit arrangement shown in FIG. 3 (i.e. the output direct current as a function of the control voltage $u_{st}$) may be adapted to suit specific requirements by a suitable choice of the ratio of the emitter areas of transistors 40 ... 43 or by means of suitably dimensioned negative-feedback resistors included in the emitter lines of transistors 40 and 41.

What is claimed is:

1. An amplifier arrangement comprising a first amplifier having at least one input and an output, a second amplifier having a low-pass frequency characteristic and an input coupled to the output of the first amplfier and an output coupled by means of at least one negative feedback branch to an input of the first amplifier to provide negative feedback, and control voltage means coupled to an input of said first amplifier for varying the negative feedback and thereby the overall gain of the amplifier arrangement, said control voltage means also being coupled to the second amplifier for varying the gain of the second amplifier such that for an increase in the overall gain of the amplifier arrangement the gain of the second amplifier also increases.

2. An amplifier arrangement as claimed in claim 1 wherein the first amplifier comprises two differential amplifiers, each differential amplifier having an input and each comprising two transistors with coupled emitters and with the collector of one transistor of each differential amplifier being coupled to the output of the first amplifier, the output of the second amplifier being coupled to respective inputs of the two differential amplifiers via two negative feedback branches providing different degrees of negative feedback.

3. An amplifier arrangement as claimed in claim 2 wherein the relationship between the output signal and the input signal of the second amplifier is determined by a controllable direct current source controlled by the control voltage means such that a direct current supplied to the second amplifier by the controllable current source increases for an increase in the overall gain.

4. An amplifier arrangement as claimed in claim 3 wherein the direct current source comprises the parallel connection of a constant-current source and a controllable direct current source that provides a direct current controlled by the control voltage means.

5. An amplifier arrangement as claimed in claim 4, wherein the controllable direct current source comprises two further transistors having a common emitter line that includes a further constant-current source, the control voltage being applied between base electrodes of the two further transistors, and wherein the direct current for the second amplifier is determined in part by the collector current of one of the two further transistors.

6. An amplifier arrangement as claimed in claim 5, wherein the collector line of the one transistor of said two further transistors includes a current mirror having an output terminal connected to the second amplifier.

7. An amplifier arrangement as claimed in claim 1 further comprising a signal input terminal coupled to said one input of the first amplifier and a signal output terminal coupled to a junction point between the output of the second amplifier and an input of said one negative feedback branch.

8. An amplifier arrangement comprising at least one differential amplifier including first and second transistors having their emitters interconnected and the collector of the second transistor coupled to an output of the differential amplifier, an input terminal coupled to said interconnected emitters of the first and second transistors for applying an input signal thereto, a variable gain amplifier with a low-pass frequency characteristic and having a signal input coupled to said output of the differential amplifier and an output coupled to an output of the amplifier arrangement and via at least one negative feedback network to said interconnected emitters of the first and second transistors, and means for applying a control voltage to the bases of the first and second transistors and to a gain control input of the variable gain amplifier whereby the control voltage simultaneously varies the gain of the differential amplifier and the gain of the variable gain amplifier thereby to reduce non-linear distortion at a high overall gain of the amplifier arrangement.

9. An amplifier arrangement as claimed in claim 8 further comprising a second differential amplifier including third and fourth transistors with their emitters interconnected and the collectors of the third and fourth transistors connected to the collectors of the first and second transistors, respectively, and the bases of the third and fourth transistors connected to the bases of the second and first transistors, respectively, and said at least one negative feedback network comprises first and second negative feedback networks providing different degrees of negative feedback, the feedback network coupling the output of the variable gain amplifier to the interconnected emitters of the first and second differential amplifiers, respectively, the signal input terminal also being coupled to the interconnected emitters of the third and fourth transistors.

10. An amplifier arrangement as claimed in claim 8 wherein said variable gain amplifier includes a source of controllable direct current responsive to said control voltage so as to vary the gain of the variable gain amplifier as a function of the amplitude and polarity of the control voltage.

11. A variable gain amplifier arrangement comprising a signal input terminal and a signal output terminal, a first amplifier, a second amplifier having a variable gain and a low-pass frequency characteristic, means coupling said first and second amplifiers in cascade between said signal input and output terminals, a negative feedback circuit coupling an output of the second amplifier to an input of the first amplifier, and a source of variable control voltage coupled to an input of the first amplifier and to a gain control input of the second amplifier thereby to simultaneously vary the effective gain of the first amplifier and the gain of the second amplifier as the control voltage is varied, the control voltage being operative to increase the gain of the second amplifier as it increases the overall gain of the amplifier arrangement.

12. An amplifier arrangement as claimed in claim 11 wherein said first amplifier comprises first and second cross-coupled differential amplifier stages having a common output coupled to an input of the second amplifier, and said negative feedback circuit comprises first and second negative feedback branches providing different degrees of negative feedback and coupled between the output of the second amplifier and first and second inputs of said first and second differential amplifier stages, respectively, the degree of negative feedback supplied to said first and second inputs being variable as a function of the control voltage.

13. An amplifier arrangement as claimed in claim 11 wherein said first amplifier comprises first and second cross-coupled differential amplifier stages having a common output coupled to an input of the second amplifier, wherein the first differential amplifier stage includes first and second transistors having their emitters interconnected and the second differential amplifier stage includes first and second transistors having their emitters interconnected, said negative feedback circuit including first and second negative feedback branches providing different degrees of negative feedback and coupled between the output of the second amplifier and the interconnected emitters of said first and second differential amplifier stages, respectively, and wherein said source of control voltage is coupled to interconnected pairs of base electrodes of the transistors of said first and second differential amplifier stages.

14. An amplifier arrangement as claimed in claim 13 wherein said input of the first amplifier comprises the interconnected emitters of the first and second differential amplifier stages and said signal input terminal is coupled to the interconnected emitters of the first and second differential amplifier stages via at least a part of said first and second negative feedback branches, respectively.

15. An amplifier arrangement as claimed in claim 11 wherein said first amplifier includes at least one differential amplifier stage comprising first and second transistors having interconnected emitter electrodes coupled to said signal input terminal, base electrodes coupled to said source of control voltage and a collector electrode coupled to an input of the second amplifier.

16. An amplifier arrangement as claimed in claim 15 wherein the negative feedback circuit comprises a voltage divider coupled between the output of the second amplifier and a signal input terminal with a tap point on the voltage divider coupled to said interconnected emitter electrodes, and wherein said variable gain amplifier includes a source of controllable direct current responsive to said source of control voltage so as to vary the slope of the variable gain amplifier and thereby the gain of said amplifier as a function of the control voltage.

* * * * *